(12) United States Patent
Chuang (10) Patent No.: US 11,488,917 B1
(45) Date of Patent: Nov. 1, 2022

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventor: Ling-Yi Chuang, Hefei (CN)

(73) Assignee: GHANGXIN MEMORY TECHNOLOGIES, INC., Hefei (CN)

(*) Notice: Subject to any disclaimer, the term of this patent is extended or adjusted under 35 U.S.C. 154(b) by 0 days.

(21) Appl. No.: 17/648,313

(22) Filed: Jan. 19, 2022

Related U.S. Application Data (63) Continuation of application No. PCT/CN2021/117523, filed on Sep. 9, 2021.

(30) Foreign Application Priority Data

Jul. 1, 2021 (CN) .......................... 202110746013.3

(51) Int. Cl.
*H01L 29/66* (2006.01)
*H01L 23/00* (2006.01)

(52) U.S. Cl.
CPC .............. *H01L 24/08* (2013.01); *H01L 24/05* (2013.01); *H01L 24/80* (2013.01); *H01L 2224/05541* (2013.01); *H01L 2224/05647* (2013.01); *H01L 2224/05684* (2013.01); *H01L 2224/08146* (2013.01); *H01L 2224/8012* (2013.01);
(Continued)

(58) Field of Classification Search
CPC combination set(s) only.
See application file for complete search history.

(56) References Cited

U.S. PATENT DOCUMENTS 5,656,863 A * 8/1997 Yasunaga .............. H01L 21/565
257/E23.021
9,754,893 B2 * 9/2017 Ding ....................... H01L 24/13
(Continued)

FOREIGN PATENT DOCUMENTS

CN 105280509 A 1/2016
CN 105448862 A 3/2016
(Continued)

OTHER PUBLICATIONS

International Search Report & Written Opinion cited in PCT/CN2021/117523 dated Apr. 2, 2022, 16 pages.

*Primary Examiner* — Niki H Nguyen
(74) *Attorney, Agent, or Firm* — Cooper Legal Group, LLC (57) ABSTRACT

The present disclosure provides a semiconductor structure and a manufacturing method thereof. The semiconductor structure includes a first chip and a second chip. A first conductive connection wire of the first chip is connected to a first conductive contact pad, and a second conductive connection wire of the second chip is connected to a second conductive contact pad. In addition, the first conductive contact pad includes a first conductor and a second conductor, and the second conductive contact pad includes a third conductor and a fourth conductor. The first conductor is directly opposite to the fourth conductor, and the second conductor is directly opposite to the third conductor. Therefore, pre-connection of the first conductive contact pad and the second conductive contact pad may be implemented and then the first chip and second chip that are pre-connected are transferred for bonding.

20 Claims, 5 Drawing Sheets

(52) U.S. Cl.
CPC ............... *H01L 2924/3512* (2013.01); *H01L 2924/37001* (2013.01)

(56) References Cited

U.S. PATENT DOCUMENTS

| | | | | |
|---|---|---|---|---|
| 2002/0011664 A1* | 1/2002 | Tanaka | ................... | H01L 24/28 257/734 |
| 2011/0244636 A1* | 10/2011 | Kondo | ................... | H01L 24/81 257/E21.502 |
| 2014/0065771 A1* | 3/2014 | Gruber | ................ | B23K 1/0016 257/E21.506 |
| 2015/0236230 A1* | 8/2015 | Miyata | ................... | H01L 33/62 438/27 |
| 2016/0043060 A1* | 2/2016 | Kabe | ...................... | H01L 24/80 257/774 |
| 2016/0141278 A1* | 5/2016 | Lai | ......................... | H01L 24/05 257/13 |
| 2016/0190103 A1* | 6/2016 | Kabe | ................... | H01L 23/564 257/777 |
| 2019/0319007 A1* | 10/2019 | Uzoh | ...................... | H01L 24/08 |
| 2020/0126906 A1* | 4/2020 | Uzoh | ...................... | H01L 24/03 |

FOREIGN PATENT DOCUMENTS

| | | |
|---|---|---|
| CN | 109411374 A | 3/2019 |
| JP | 2014183100 A | 9/2014 |

\* cited by examiner

SEMICONDUCTOR STRUCTURE AND MANUFACTURING METHOD THEREOF

CROSS-REFERENCE TO RELATED APPLICATIONS

This is a continuation of International Patent Application No. PCT/CN2021/117523, filed on Sep. 9, 2021, which claims the priority to Chinese Patent Application No. 202110746013.3, titled "SEMICONDUCTOR STRUCTURE AND MANUFACTURING METHOD THEREOF" and filed on Jul. 1, 2021. The entire contents of International Patent Application No. PCT/CN2021/117523 and Chinese Patent Application No. 202110746013.3 are incorporated herein by reference.

TECHNICAL FIELD

The present disclosure relates to the technical field of semiconductors, and in particular to a semiconductor structure and a manufacturing method thereof.

BACKGROUND

In the related art, chips are bonded through interconnection of metal pads on the chips. The stacked chips need to be transferred before further bonding. If there is vibration or an external force influence, the stacked chips cannot be aligned due to slippage, which may increase the manufacturing difficulty.

SUMMARY

The present disclosure provides a semiconductor structure and a manufacturing method thereof, to improve the performance of the semiconductor structure.

According to a first aspect, the present disclosure provides a semiconductor structure, including:

a first chip, where the first chip includes a first substrate, a first conductive connection wire and a first conductive contact pad, the first conductive contact pad is connected to the first conductive connection wire, the first conductive contact pad includes a first conductor and a second conductor, and a melting point of the first conductor is higher than a melting point of the second conductor; and a second chip, where the second chip includes a second substrate, a second conductive connection wire and a second conductive contact pad, the second conductive contact pad is connected to the second conductive connection wire, the second conductive contact pad includes a third conductor and a fourth conductor, and a melting point of the third conductor is higher than a melting point of the fourth conductor;

where the first conductor is directly opposite to the fourth conductor, and the second conductor is directly opposite to the third conductor, such that a bonding structure is formed between the first conductive contact pad and the second conductive contact pad.

According to a second aspect, the present disclosure provides a method of manufacturing a semiconductor structure, including:

providing a first chip, where the first chip includes a first substrate, a first conductive connection wire and a first conductive contact pad, the first conductive contact pad is connected to the first conductive connection wire, the first conductive contact pad includes a first conductor and a second conductor, and a melting point of the first conductor is higher than a melting point of the second conductor;

providing a second chip, where the second chip includes a second substrate, a second conductive connection wire and a second conductive contact pad, the second conductive contact pad is connected to the second conductive connection wire, the second conductive contact pad includes a third conductor and a fourth conductor, and a melting point of the third conductor is higher than a melting point of the fourth conductor;

aligning the first chip with the second chip, such that the first conductor is directly opposite to the fourth conductor, and the second conductor is directly opposite to the third conductor; and connecting the first chip and the second chip.

BRIEF DESCRIPTION OF THE DRAWINGS

The preferred embodiments of the present disclosure are described in detail below with reference to the accompanying drawings to make the objectives, features and advantages of the present disclosure more obvious. The drawings are merely exemplary illustrations of the present disclosure, and are not necessarily drawn to scale. The same reference numerals in the drawings always represent the same parts. In the drawings.

DETAILED DESCRIPTION

The typical embodiments embodying the features and advantages of the present disclosure are described in detail below. It should be understood that the present disclosure may have various changes in different embodiments, which do not depart from the scope of the present disclosure. The description and drawings herein are essentially used for the purpose of explanation, rather than limiting the present disclosure.

Different exemplary embodiments of the present disclosure are described below with reference to the accompanying drawings. The accompanying drawings form a part of the present disclosure, which show by way of example different exemplary structures, systems and steps that can implement various aspects of the present disclosure. It should be understood that other specific solutions of components, structures, exemplary devices, systems and steps may be used, and structural and functional modifications may be made without departing from the scope of the present disclosure. Moreover, although the terms such as "above", "between" and "within" may be used in this specification to describe different exemplary features and elements of the present disclosure, these terms are used herein only for convenience of description, for example, according to the directions of the examples in the drawings. Nothing in this specification should be understood as requiring a specific three-dimensional direction of the structure to fall within the scope of the present disclosure.

Figure 1:
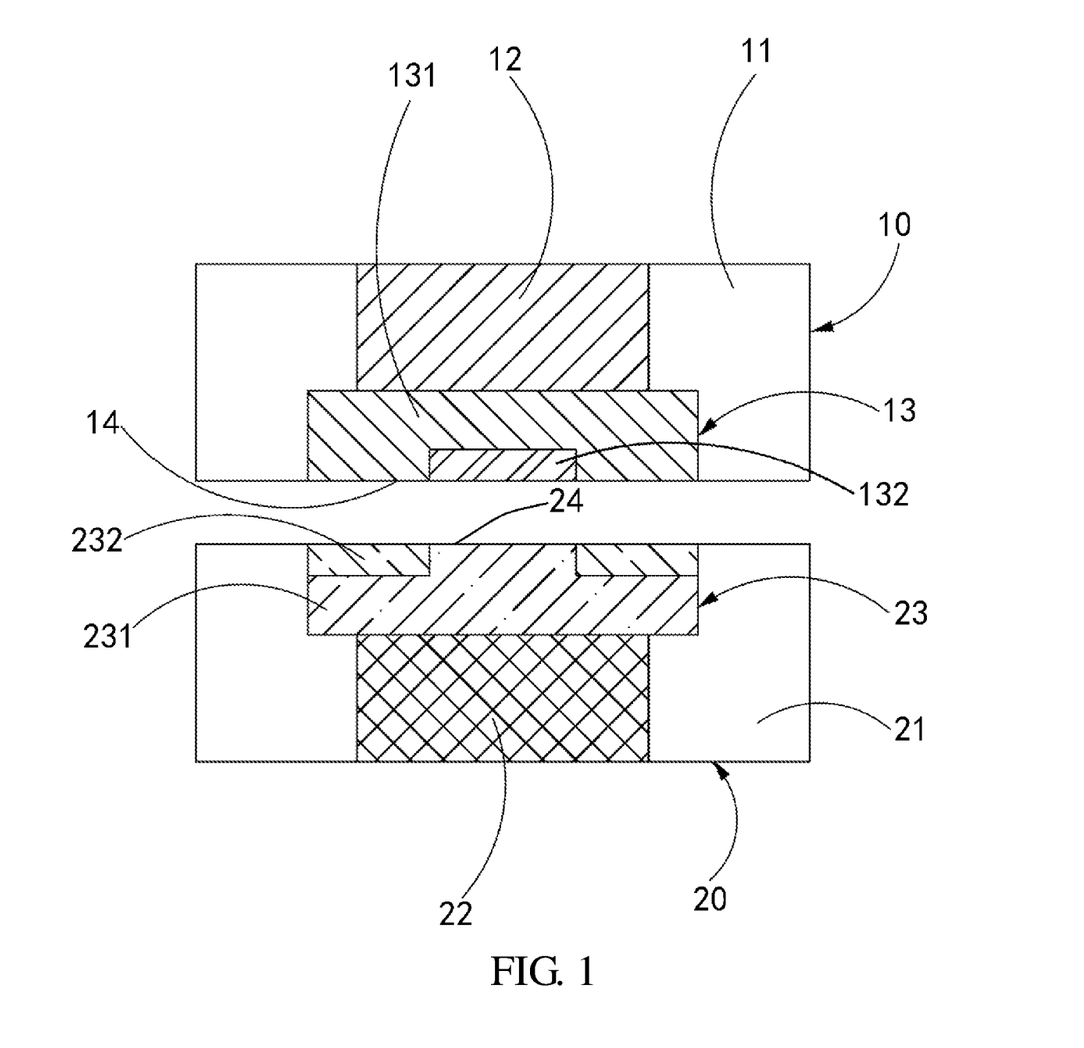
FIG. 1 is a schematic structural diagram illustrating decomposition of a first chip and a second chip of a semiconductor structure according to an exemplary implementation.
Figure 2:
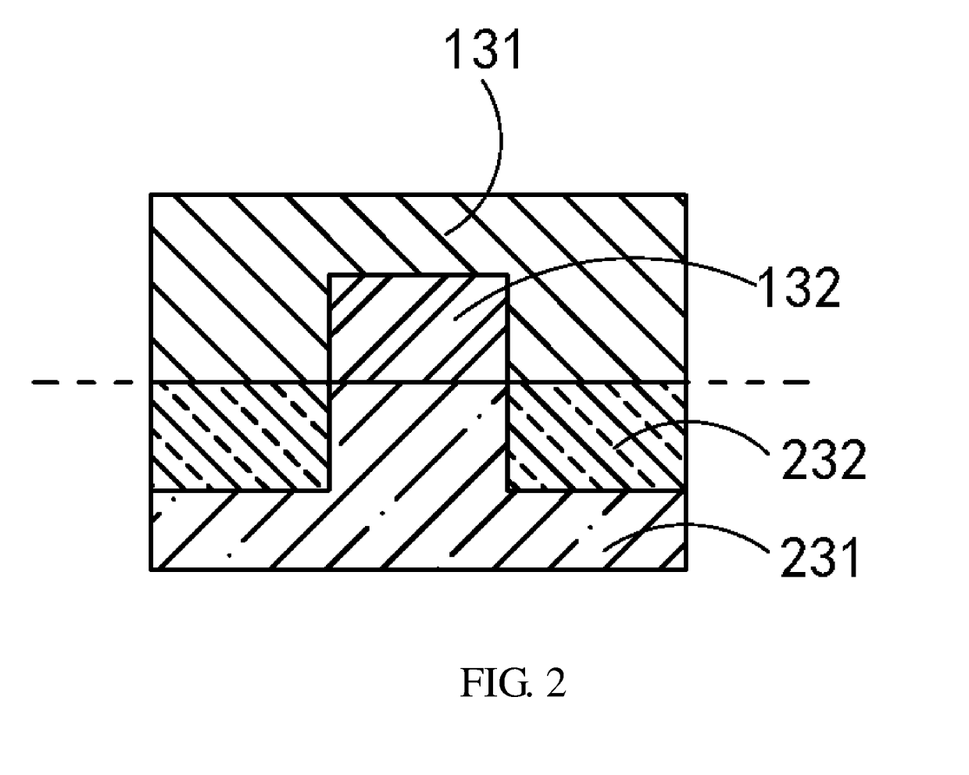
FIG. 2 is a schematic structural diagram illustrating local connection of a first chip and a second chip of a semiconductor structure according to an exemplary implementation.

An embodiment of the present disclosure provides a semiconductor structure. With reference to FIGS. 1 and 2, the semiconductor structure includes a first chip 10 and a second chip 20. The first chip 10 includes a first substrate 11, a first conductive connection wire 12 and a first conductive contact pad 13, where the first conductive contact pad 13 is connected to the first conductive connection wire 12 and includes a first conductor 131 and a second conductor 132, and a melting point of the first conductor 131 is higher than that of the second conductor 132. The second chip 20 includes a second substrate 21, a second conductive connection wire 22 and a second conductive contact pad 23, where the second conductive contact pad 23 is connected to the second conductive connection wire 22 and includes a third conductor 231 and a fourth conductor 232, and a melting point of the third conductor 231 is higher than that of the fourth conductor 232. The first conductor 131 is directly opposite to the fourth conductor 232, and the second conductor 132 is directly opposite to the third conductor 231, such that a bonding structure is formed between the first conductive contact pad 13 and the second conductive contact pad 23.

The semiconductor structure according to the embodiment of the present disclosure includes the first chip 10 and the second chip 20. The first conductive connection wire 12 of the first chip 10 is connected to the first conductive contact pad 13, and the second conductive connection wire 22 of the second chip 20 is connected to the second conductive contact pad 23. In addition, the first conductive contact pad 13 includes the first conductor 131 and the second conductor 132, and the second conductive contact pad 23 includes the third conductor 231 and the fourth conductor 232. The first conductor 131 is directly opposite to the fourth conductor 232, and the second conductor 132 is directly opposite to the third conductor 231. Moreover, the melting point of the first conductor 131 is higher than that of the second conductor 132, and the melting point of the third conductor 231 is higher than that of the fourth conductor 232. Therefore, the second conductor 132 and the fourth conductor 232 may be melted at a first temperature, that is, pre-connection of the first conductive contact pad 13 and the second conductive contact pad 23 is implemented. After that, the first chip 10 and the second chip 20 that are pre-connected are transferred to an annealing condition at a second temperature for bonding, so as to implement reliable bonding of the first conductive contact pad 13 and the second conductive contact pad 23. Before the transfer, the first chip 10 and the second chip 20 have been pre-connected, such that relative movement between the first chip 10 and the second chip 20 is avoided, which ensures reliable alignment of the first chip 10 and the second chip 20, thereby improving the performance of the semiconductor structure.

It should be noted that, at the first temperature, the second conductor 132 and the fourth conductor 232 are melted, while the first conductor 131 and the third conductor 231 are not melted. At the moment, conductive materials of the first conductive contact pad 13 and the second conductive contact pad 23 may each be interpenetrated and fused at an interface, as shown in FIG. 2. Therefore, an intermetallic compound (IMC) is formed and the pre-connection of the first conductive contact pad 13 and the second conductive contact pad 23 is implemented. Or, even though the conductive materials of the first conductive contact pad 13 and the second conductive contact pad 23 are not each interpenetrated and fused at the interface, the melted second conductor 132 and fourth conductor 232 may also be connected to the third conductor 231 and the first conductor 131 after cooling. As a result, the pre-connection of the first conductive contact pad 13 and the second conductive contact pad 23 may also be implemented. The first conductive contact pad 13 and the second conductive contact pad 23 are pre-connected, such that relative slippage of the first chip 10 and the second chip 20 does not occur in a subsequent process of transferring the first chip 10 and the second chip 20. In this way, it is ensured that the first chip 10 and the second chip 20 may be bonded to each other under the annealing condition at the second temperature after the first chip 10 and the second chip 20 are reliably aligned. Therefore, the reliable bonding of the first conductive contact pad 13 and the second conductive contact pad 23 is implemented, and the reliable bonding structure is formed between the first conductive contact pad 13 and the second conductive contact pad 23. In the related art, the first chip 10 and the second chip 20 need to be directly placed in a high-temperature environment for bonding. In the transfer process, the alignment is influenced by slippage, which may influence the performance of the semiconductor structure. The semiconductor structure in the embodiment can improve the alignment problem in the related art, so as to improve the performance of the semiconductor structure.

After completion of the bonding of the first conductive contact pad 13 and the second conductive contact pad 23, an IMC layer is formed on a junction surface of the first conductive contact pad 13 and the second conductive contact pad 23, and the IMC layer is as wide as the first conductive contact pad 13 and/or the second conductive contact pad 23. The first conductor 131 is directly opposite to the fourth conductor 232, and the second conductor 132 is directly opposite to the third conductor 231. In addition, the melting point of the first conductor 131 is higher than that of the second conductor 132, and the melting point of the third conductor 231 is higher than that of the fourth conductor 232. That is, it may be understood that the second conductor 132 with a lower melting point is accommodated in the first conductor 131, similarly, a recess is formed in the first conductor 131; and the third conductor 231 with a higher melting point is accommodated in the fourth conductor 232, similarly, a recess is formed in the fourth conductor 232. Moreover, if the second conductor 132 and the fourth conductor 232 are removed, a protrusion of the first conductive contact pad 13 corresponds to a recess of the second conductive contact pad 23, and a recess of the first conductive contact pad 13 corresponds to a protrusion of the second conductive contact pad 23. A coefficient of thermal expansion of the first conductor 131 is higher than that of the second conductor 132, and a coefficient of thermal expansion of the third conductor 231 is higher than that of the fourth conductor 232. In this way, the first conductive contact pad 13 and the second conductive contact pad 23 are maximally matched with thermal expansion of metal, that is, a part with high thermal expansion is matched with a part with low thermal expansion. Therefore, both the first conductive contact pad 13 and the second conductive contact pad 23 may have redundant spaces for expansion, thereby preventing cracks.

The first conductor 131 is directly opposite to the fourth conductor 232 and the second conductor 132 is directly opposite to the third conductor 231, which actually illustrates a position relationship of the first chip 10 and the second chip 20 before the bonding. After the bonding, that is, when the bonding structure is formed between the first conductive contact pad 13 and the second conductive contact pad 23, there may not always be the position relationship, and a corresponding position relationship may not be determined between the conductive materials due to fusion. However, the position relationship may be judged from material configuration.

In some embodiments, both the first conductive connection wire 12 and the first conductive contact pad 13 are located in the first substrate 11, and both the second conductive connection wire 22 and the second conductive contact pad 23 are located in the second substrate 21.

The first conductive connection wire 12 and the first conductive contact pad 13 may be partially or entirely located in the first substrate 11. Correspondingly, the second conductive connection wire 22 and the second conductive contact pad 23 may be partially or entirely located in the second substrate 21.

In some embodiments, the first conductive contact pad 13 may be located on a surface of the first substrate 11. Correspondingly, the second conductive contact pad 23 may be located on a surface of the second substrate 21.

It should be noted that after the first chip 10 and the second chip 20 are bonded, the first substrate 11 and the second substrate 21 are bonded to each other. The first substrate 11 includes a silicon substrate and an insulating layer formed above the silicon substrate, a part of the first conductive connection wire 12 is located in the insulating layer, and the first conductive contact pad 13 is formed in the insulating layer. Correspondingly, the second substrate 21 includes a silicon substrate and an insulating layer formed above the silicon substrate, a part of the second conductive connection wire 22 is located in the insulating layer, and the second conductive contact pad 23 is formed in the insulating layer. When the first chip 10 and the second chip 20 are bonded, the first conductive contact pad 13 and the second conductive contact pad 23 are bonded to each other, and the insulating layers of the first chip 10 and the second chip 20 are bonded to each other.

Specifically, the silicon substrates may be made of a silicon-containing material. The silicon substrates may be made of any proper material, for example, including at least one of silicon, monocrystalline silicon, polycrystalline silicon, amorphous silicon, silicon-germanium, monocrystalline silicon-germanium, polycrystalline silicon-germanium or carbon-doped silicon.

The insulating layers may include silicon dioxide ($SiO_2$), silicon oxide carbon (SiOC), silicon nitride (SiN), silicon carbon nitride (SiCN), and other related insulating materials used in an integrated circuit.

In an embodiment, the first conductive connection wire 12 is a first through-silicon via, and the second conductive connection wire 22 is a second through-silicon via. The first through-silicon via and the second through-silicon via are connected through the first conductive contact pad 13 and the second conductive contact pad 23. In some embodiments, the second conductor 132 corresponds to a center region of the first through-silicon via. Due to maximal overall expansion of the center region of the first through-silicon via, a thickness of the second conductor 132 may be greater than a thickness of the fourth conductor 232, such that an enough redundant space for expansion is retained for the first through-silicon via. In some embodiments, the fourth conductor 232 corresponds to a center region of the second through-silicon via, and the second conductor 132 may be thinner than the fourth conductor 232.

In some embodiments, a thickness of the second conductor 132 may be equal to a thickness of the fourth conductor 232.

In an embodiment, a thickness of the second conductor 132 is less than 1 um, and a thickness of the fourth conductor 232 is less than 1 um.

In an embodiment, as shown in FIG. 1, an end of the first conductive contact pad 13 facing toward the second conductive contact pad 23 is a first contact surface 14, and an end of the second conductive contact pad 23 facing toward the first contact surface 14 is a second contact surface 24. The first conductor 131 and the second conductor 132 occupy different parts of the first contact surface 14 respectively, and the third conductor 231 and the fourth conductor 232 occupy different parts of the second contact surface 24 respectively. When the first chip 10 and the second chip 20 are bonded, the first contact surface 14 and the second contact surface 24 are butted to implement electrical connection of the first conductive contact pad 13 and the second conductive contact pad 23.

In some embodiments, the first conductor 131 and the second conductor 132 occupy a part of the first contact surface 14, that is, the first conductive contact pad 13 may also include other conductors. Correspondingly, the third conductor 231 and the fourth conductor 232 occupy a part of the second contact surface 24, and the second conductive contact pad 23 may also include other conductors.

In some embodiments, the first conductor 131 and the second conductor 132 occupy the whole first contact surface 14, that is, the first conductive contact pad 13 may include only the first conductor 131 and the second conductor 132. Or the first conductive contact pad 13 may include other conductors that are not located at an end of the first conductive contact pad 13 away from the first conductive connection wire 12. Correspondingly, the third conductor 231 and the fourth conductor 232 occupy the whole second contact surface 24, that is, the second conductive contact pad 23 may include only the third conductor 231 and the fourth conductor 232. Or the second conductive contact pad 23 may include other conductors that are not located at an end of the second conductive contact pad 23 away from the second conductive connection wire 22.

In an embodiment, an area of the first contact surface 14 is equal to that of the second contact surface 24, that is, an area of a fusion surface of the first chip 10 is equal to an area of a fusion surface of the second chip 20. When the first conductor 131 and the second conductor 132 occupy the whole first contact surface 14, and the third conductor 231 and the fourth conductor 232 occupy the whole second contact surface 24, an area occupied by the first conductor 131 on the first contact surface 14 is equal to an area occupied by the fourth conductor 232 on the second contact surface 24, and an area occupied by the second conductor 132 on the first contact surface 14 is equal to an area occupied by the third conductor 231 on the second contact surface 24. In this way, it is ensured that the first conductor 131 is directly opposite to the fourth conductor 232, and the second conductor 132 is directly opposite to the third conductor 231.

In some embodiments, when the area of the first contact surface 14 is equal to that of the second contact surface 24, the first conductor 131 and the second conductor 132 occupy a part of the first contact surface 14, and the third conductor 231 and the fourth conductor 232 occupy a part of the second contact surface 24, it may be ensured that the first conductor 131 is directly opposite to the fourth conductor 232, the second conductor 132 is directly opposite to the third conductor 231, and the other conductors included by the first conductive contact pad 13 are directly opposite to the other conductors included by the second conductive contact pad 23.

In an embodiment, the area of the first contact surface 14 is unequal to that of the second contact surface 24, that is, the area of the fusion surface of the first chip 10 is unequal to the area of the fusion surface of the second chip 20. When the area of the first contact surface 14 is smaller than that of the second contact surface 24, a part of the second contact surface 24 is opposite to the first substrate 11. Correspondingly, when the area of the first contact surface 14 is greater than that of the second contact surface 24, a part of the first contact surface 14 is opposite to the second substrate 21.

It should be noted that when the area of the first contact surface 14 is unequal to that of the second contact surface 24, for example, when the area of the first contact surface 14 is smaller than that of the second contact surface 24, the first conductor 131 and the second conductor 132 may occupy the whole first contact surface 14, and the third conductor 231 and the fourth conductor 232 may also occupy the whole second contact surface 24. At the moment, it should be ensured that the whole first conductor 131 is directly opposite to the fourth conductor 232 and the whole second conductor 132 is directly opposite to the third conductor 231. Moreover, the other part of at least one of the third conductor 231 and the fourth conductor 232 of the second conductive contact pad 23 may directly correspond to the first substrate 11. Correspondingly, when the area of the first contact surface 14 is greater than that of the second contact surface 24, reference may also be made to the embodiment, and details are not described herein.

In an embodiment, a circumferential outer edge of the first contact surface 14 includes at least one of a straight line or a curve, and a circumferential outer edge of the second contact surface 24 includes at least one of a straight line or a curve. The first contact surface 14 may have a shape identical with or different from that of the second contact surface 24, and the shape of the first contact surface 14 and the shape of the second contact surface 24 may be circular, elliptical, rectangular and the like, which is not limited herein.

It should be noted that, when the area of the first contact surface 14 is equal to that of the second contact surface 24, the first conductor 131 and the second conductor 132 occupy the whole first contact surface 14, and the third conductor 231 and the fourth conductor 232 occupy the whole second contact surface 24, it may be illustrated that the first contact surface 14 has the shape identical with that of the second contact surface 24, and the first contact surface 14 exactly coincides with the second contact surface 24.

In an embodiment, a volume occupied by the first conductor 131 in the first conductive contact pad 13 is greater than a volume occupied by the second conductor 132 in the first conductive contact pad 13, and a volume occupied by the third conductor 231 in the second conductive contact pad 23 is greater than a volume occupied by the fourth conductor 232 in the second conductive contact pad 23. That is, proportions of low-melting point conductive materials of the first conductive contact pad 13 and the second conductive contact pad 23 are relatively low. When the first chip 10 and the second chip 20 are bonded, the second conductor 132 and the fourth conductor 232 are used to ensure pre-connection, and the first conductive contact pad 13 and the second conductive contact pad 23 are electrically connected to other structures mainly through the first conductor 131 and the third conductor 231.

In an embodiment, an end of each first conductive connection wire 12 is connected to the first conductor 131, and an end of each second conductive connection wire 22 is connected to the third conductor 231. That is, the second conductor 132 is included only on a side of the first conductive contact pad 13 away from the first conductive connection wire 12, and the fourth conductor 232 is included only on a side of the second conductive contact pad 23 away from the second conductive connection wire 22.

It should be noted that an end of each first conductive connection wire 12 is connected to the first conductor 131, and an end of each second conductive connection wire 22 is connected to the third conductor 231. It may be further understood that, before the first chip 10 and the second chip 20 are bonded, an end of each first conductive connection wire 12 is connected to the first conductor 131 and an end of each second conductive connection wire 22 is connected to the third conductor 231. After the bonding structure is formed between the first conductive contact pad 13 and the second conductive contact pad 23, there may be a possibility of fusion between the conductive materials. However, a structure relationship may also be judged from material configuration.

In an embodiment, the second conductor 132 includes a plurality of first sub-conductive sections 1321, and a part of the first conductor 131 is clamped between adjacent first sub-conductive sections 1321. That is, it may be understood that voids are formed on a side of the first conductor 131 away from the first conductive connection wire 12, so as to fill the first sub-conductive sections 1321.

In an embodiment, the fourth conductor 232 includes a plurality of second sub-conductive sections 2321, and a part of the third conductor 231 is clamped between adjacent second sub-conductive sections 2321. That is, it may be understood that voids are formed on a side of the third conductor 231 away from the second conductive connection wire 22, so as to fill the second sub-conductive sections 2321.

Figure 3:
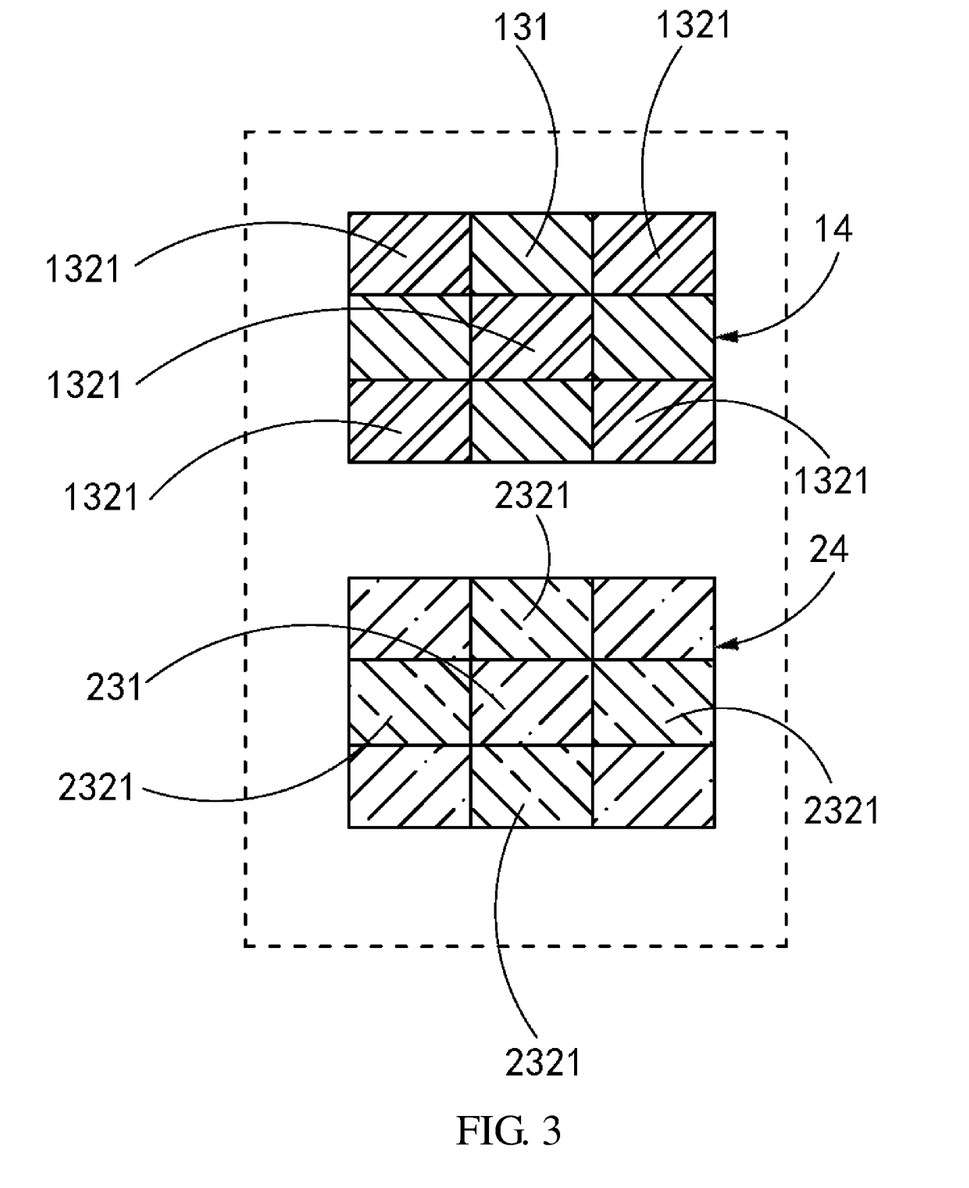
FIG. 3 is a schematic structural diagram of a first contact surface and a second contact surface of a semiconductor structure according to an exemplary implementation.

As shown in FIGS. 1 and 3, the area of the first contact surface 14 is equal to that of the second contact surface 24. The first conductor 131 and the second conductor 132 occupy the whole first contact surface 14, and the third conductor 231 and the fourth conductor 232 occupy the whole second contact surface 24. In addition, the area occupied by the first conductor 131 on the first contact surface 14 is smaller than the area occupied by the second conductor 132 on the first contact surface 14, and the area occupied by the third conductor 231 on the second contact surface 24 is greater than the area occupied by the fourth conductor 232 on the second contact surface 24. Therefore, it is ensured that the first conductor 131 is directly opposite to the fourth conductor 232, and the second conductor 132 is directly opposite to the third conductor 231. Moreover, the second conductor 132 includes a plurality of first sub-conductive sections 1321, and the fourth conductor 232 includes a plurality of second sub-conductive sections 2321.

Figure 4:
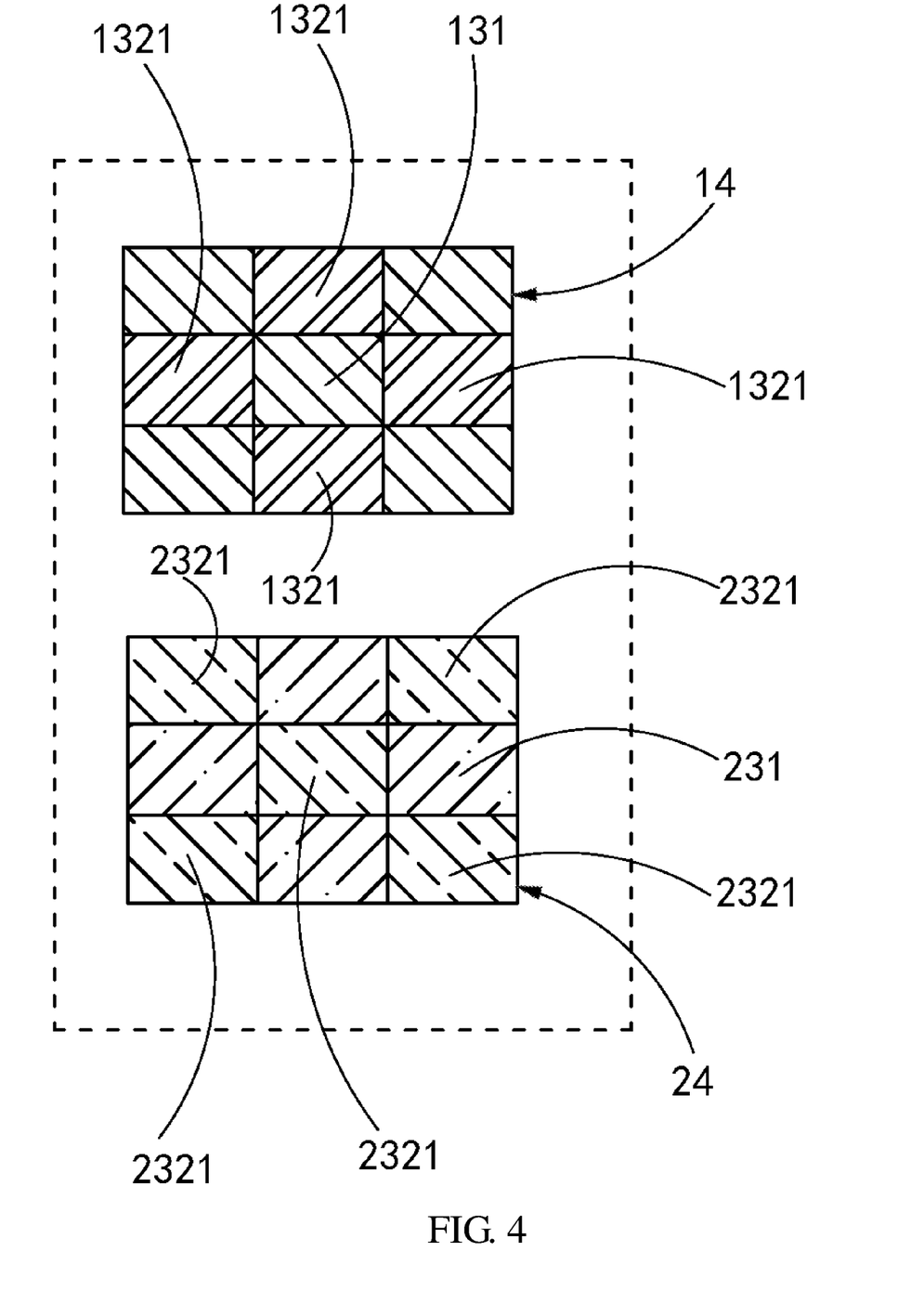
FIG. 4 is a schematic structural diagram of a first contact surface and a second contact surface of a semiconductor structure according to another exemplary implementation.

As shown in FIG. 4, the area of the first contact surface 14 is equal to that of the second contact surface 24. The first conductor 131 and the second conductor 132 occupy the whole first contact surface 14, and the third conductor 231 and the fourth conductor 232 occupy the whole second contact surface 24. In addition, the area occupied by the first conductor 131 on the first contact surface 14 is greater than the area occupied by the second conductor 132 on the first contact surface 14, and the area occupied by the third conductor 231 on the second contact surface 24 is smaller than the area occupied by the fourth conductor 232 on the second contact surface 24. Therefore, it is ensured that the first conductor 131 is directly opposite to the fourth conductor 232, and the second conductor 132 is directly opposite to the third conductor 231. Moreover, the second conductor 132 includes a plurality of first sub-conductive sections 1321, and the fourth conductor 232 includes a plurality of second sub-conductive sections 2321.

In an embodiment, a material of the first conductor 131 may be the same as a material of the third conductor 231, the first conductor 131 includes at least one of copper or tungsten, and the third conductor 231 includes at least one of copper or tungsten. Certainly, In some embodiments, it is not excluded that the material of the first conductor 131 is different from the material of the third conductor 231 are different, but the melting point of the first conductor is approximately the same as the melting point of the third conductor.

In an embodiment, a material of the second conductor 132 may be the same as a material of the fourth conductor 232, the first conductor 131 includes at least one of copper or tungsten, and the second conductor 132 includes at least one of bismuth, cadmium, tin, lead, dysprosium or indium. Certainly, in some embodiments, it is not excluded that the material of the second conductor 132 is different from the material of the fourth conductor 232, but the melting point of the second conductor is approximately the same as the melting point of the fourth conductor.

It should be noted that the first conductor 131 and the third conductor 231 may include only single material, for example, both the first conductor 131 and the third conductor 231 may be copper. The first conductor 131 and the third conductor 231 may also be alloys, for example, copper-tungsten alloys. The second conductor 132 and the fourth conductor 232 may include only single material, for example, both the second conductor 132 and the fourth conductor 232 may be tin. Or, the second conductor 132 and the fourth conductor 232 may be alloys, for example, bismuth-tin, bismuth-lead, tin-indium and the like.

In an embodiment, the first conductor 131 and the third conductor 231 may be copper, and the second conductor 132 and the fourth conductor 232 may be tin. Due to a combination effect of low-melting point metal tin and a thermal expansion effect of metal copper, a copper surface is slightly indented to be smoothly fused with a low-melting point metal tin layer. During low-temperature (such as the first temperature) fusion, on upper and lower layers, tin (Sn) and copper (Cu) are each interpenetrated and fused at the interface, and tin is fused with nearby copper to form a Cu5Sn6 intermetallic compound (IMC). The upper and lower layers are made of different materials and alternately mixed, such that an area of the IMC can be increased to improve the bonding strength, and resistance for slippage of stacked chips caused by external force or movement is provided to the stacked chips (especially alignment accuracy of chips on upper and lower layers). Therefore, benefit is brought to the bonding of the upper and lower layers of first conductive contact pad 13 and the second conductive contact pad 23 that undergo high-temperature (such as the second temperature) annealing afterwards, so as to improve the product yield.

According to the semiconductor structure of the present disclosure, the upper and lower layers of low-melting point metal/alloys fused at a low temperature may be bonded firstly, and then fused with nearby metal to form intermetallic compounds so as to increase the bonding strength. Therefore, an alignment rate is provided for the bonding of the upper and lower layers of high-fusion point metal/metal that undergo high-temperature annealing afterwards, so as to enhance the yield of the semiconductor structure.

Figure 5:
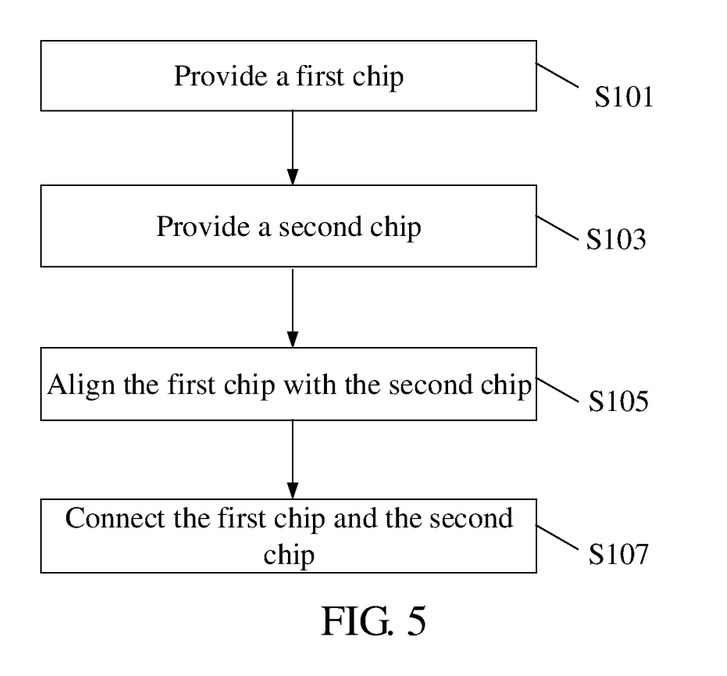
FIG. 5 is a schematic flowchart of a method of manufacturing a semiconductor structure according to an exemplary implementation.

An embodiment of the present disclosure further provides a method of manufacturing a semiconductor structure. With reference to FIG. 5, the method of manufacturing a semiconductor includes the following steps.

S101: Provide a first chip 10. The first chip 10 includes a first substrate 11, a first conductive connection wire 12 and a first conductive contact pad 13, the first conductive contact pad 13 is connected to the first conductive connection wire 12 and includes a first conductor 131 and a second conductor 132, and a melting point of the first conductor 131 is higher than that of the second conductor 132.

S103: Provide a second chip 20. The second chip 20 includes a second substrate 21, a second conductive connection wire 22 and a second conductive contact pad 23, the second conductive contact pad 23 is connected to the second conductive connection wire 22 and includes a third conductor 231 and a fourth conductor 232, and a melting point of the third conductor 231 is higher than that of the fourth conductor 232.

S105: Align the first chip 10 with the second chip 20. In this way, the first conductor 131 is directly opposite to the fourth conductor 232 and the second conductor 132 is directly opposite to the third conductor 231.

S107: Connect the first chip 10 and the second chip 20.

According to the method of manufacturing a semiconductor structure according to the embodiment of the present disclosure, the first conductive connection wire 12 of the first chip 10 is connected to the first conductive contact pad 13, and the second conductive connection wire 22 of the second chip 20 is connected to the second conductive contact pad 23. In addition, the first conductive contact pad 13 includes the first conductor 131 and the second conductor 132, and the second conductive contact pad 23 includes the third conductor 231 and the fourth conductor 232. The first conductor 131 is directly opposite to the fourth conductor 232, and the second conductor 132 is directly opposite to the third conductor 231. Moreover, the melting point of the first conductor 131 is higher than that of the second conductor 132, and the melting point of the third conductor 231 is higher than that of the fourth conductor 232. Therefore, pre-connection of the first conductive contact pad 13 and the second conductive contact pad 23 may be firstly implemented and then high-temperature bonding is performed to implement reliable bonding of the first conductive contact pad 13 and the second conductive contact pad 23. Before the transfer, the first chip 10 and the second chip 20 have been pre-connected, such that relative movement between the first chip 10 and the second chip 20 is avoided, which ensures reliable alignment of the first chip 10 and the second chip 20, thereby improving the performance of the semiconductor structure.

In an embodiment, S107 includes: melt the second conductor 132 and the fourth conductor 232 at a first temperature, such that the first chip 10 is connected to the second chip 20. The first temperature is lower than the melting point of the first conductor 131 and the melting point of the third conductor 231. That is, at the first temperature, the second conductor 132 and the fourth conductor 232 are melted, while the first conductor 131 and the third conductor 231 are not melted. At the moment, conductive materials of the first conductive contact pad 13 and the second conductive contact pad 23 may be each interpenetrated and fused at an interface to form a pre-bonding structure.

In an embodiment, S107 further includes: bond the connected first chip 10 and the connected second chip 20 under an annealing condition at a second temperature, such that a bonding structure is formed after the first conductive contact pad 13 and the second conductive contact pad 23 are melted. The first temperature is lower than the second temperature. The first conductive contact pad 13 and the second conductive contact pad 23 form the pre-bonding structure at the first temperature, so as to move to an environment at the second temperature for bonding. Therefore, the first chip 10 and the second chip 20 may be prevented from relative slippage, thereby improving the yield of the semiconductor structure.

It should be noted that a specific process of bonding the first chip 10 and the second chip 20 under the annealing condition at the second temperature is not limited, and reference may be made to a bonding manner in the related art. It is focused herein that the first chip 10 and the second chip 20 have been pre-connected before the bonding under the annealing condition at the second temperature.

In an embodiment, the second conductor 132 is formed on the first conductor 131 through electroplating or printing, and the fourth conductor 232 is formed on the third conductor 231 through electroplating or printing.

It should be noted that, in an embodiment, the method of manufacturing a semiconductor structure is used to form the semiconductor structure. For materials and structures of the first chip 10 and the second chip 20 involved in the method of manufacturing a semiconductor structure, reference may be made to specification of the semiconductor structure, and details are not described herein.

Those skilled in the art may easily figure out other implementations of the present disclosure after considering the specification and practicing the content disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and implementations are merely considered as illustrative, and the real scope and spirit of the present disclosure are directed by the appended claims.

It should be noted that, the present disclosure is not limited to the precise structures that have been described above and shown in the accompanying drawings, and can be modified and changed in many ways without departing from the scope of the present disclosure. The scope of the present disclosure is defined by the appended claims.

The invention claimed is:

1. A semiconductor structure, comprising:
a first chip, wherein the first chip comprises a first substrate, a first conductive connection wire and a first conductive contact pad, the first conductive contact pad is connected to the first conductive connection wire, the first conductive contact pad comprises a first conductor and a second conductor, and a melting point of the first conductor is higher than a melting point of the second conductor; and
a second chip, wherein the second chip comprises a second substrate, a second conductive connection wire and a second conductive contact pad, the second conductive contact pad is connected to the second conductive connection wire, the second conductive contact pad comprises a third conductor and a fourth conductor, and a melting point of the third conductor is higher than a melting point of the fourth conductor;
wherein the first conductor is directly opposite to the fourth conductor, and the second conductor is directly opposite to the third conductor, such that a bonding structure is formed between the first conductive contact pad and the second conductive contact pad.

2. The semiconductor structure according to claim 1, wherein an end of the first conductive contact pad facing toward the second conductive contact pad is a first contact surface, and an end of the second conductive contact pad facing toward the first contact surface is a second contact surface;
wherein the first conductor and the second conductor occupy different parts of the first contact surface respectively, and the third conductor and the fourth conductor occupy different parts of the second contact surface respectively.

3. The semiconductor structure according to claim 2, wherein the first conductor and the second conductor occupy a whole first contact surface, and the third conductor and the fourth conductor occupy a whole second contact surface.

4. The semiconductor structure according to claim 3, wherein an area of the first contact surface is equal to an area of the second contact surface; and
an area occupied by the first conductor on the first contact surface is equal to an area occupied by the fourth conductor on the second contact surface.

5. The semiconductor structure according to claim 3, wherein an area of the first contact surface is unequal to an area of the second contact surface.

6. The semiconductor structure according to claim 2, wherein a circumferential outer edge of the first contact surface comprises at least one of a straight line or a curve, and a circumferential outer edge of the second contact surface comprises at least one of a straight line or a curve.

7. The semiconductor structure according to claim 1, wherein a volume occupied by the first conductor in the first conductive contact pad is greater than a volume occupied by the second conductor in the first conductive contact pad; and
a volume occupied by the third conductor in the second conductive contact pad is greater than a volume occupied by the fourth conductor in the second conductive contact pad.

8. The semiconductor structure according to claim 7, wherein one end of the first conductive connection wire is completely connected on the first conductor; and
one end of the second conductive connection wire is completely connected to the third conductor.

9. The semiconductor structure according to claim 8, wherein at least one of:
the second conductor comprises a plurality of first sub-conductive sections, and a part of the first conductor is clamped between adjacent first sub-conductive sections; or
the fourth conductor comprises a plurality of second sub-conductive sections, and a part of the third conductor is clamped between adjacent second sub-conductive sections.

10. The semiconductor structure according to claim 7, wherein the first conductor comprises at least one of copper or tungsten, and the second conductor comprises at least one of bismuth, cadmium, tin, lead, dysprosium or indium; and
the third conductor comprises at least one of copper or tungsten, and the fourth conductor comprises at least one of bismuth, cadmium, tin, lead, dysprosium or indium.

11. The semiconductor structure according to claim 1, wherein the first conductive connection wire is a first through-silicon via; and the second conductive connection wire is a second through-silicon via.

12. The semiconductor structure according to claim 1, wherein both the first conductive connection wire and the first conductive contact pad are located in the first substrate.

13. The semiconductor structure according to claim 1, wherein both the second conductive connection wire and the second conductive contact pad are located in the second substrate.

14. The semiconductor structure according to claim 1, wherein a material of the first conductor is the same as a material of the third conductor.

15. The semiconductor structure according to claim 1, wherein a material of the second conductor is the same as a material of the fourth conductor.

16. The semiconductor structure according to claim 1, wherein a thickness of the second conductor is less than 1 um, and a thickness of the fourth conductor is less than 1 um.

17. A method of manufacturing a semiconductor structure, comprising:

providing a first chip, wherein the first chip comprises a first substrate, a first conductive connection wire and a first conductive contact pad, the first conductive contact pad is connected to the first conductive connection wire, the first conductive contact pad comprises a first conductor and a second conductor, and a melting point of the first conductor is higher than a melting point of the second conductor;

providing a second chip, wherein the second chip comprises a second substrate, a second conductive connection wire and a second conductive contact pad, the second conductive contact pad is connected to the second conductive connection wire, the second conductive contact pad comprises a third conductor and a fourth conductor, and a melting point of the third conductor is higher than a melting point of the fourth conductor;

aligning the first chip with the second chip, such that the first conductor is directly opposite to the fourth conductor, and the second conductor is directly opposite to the third conductor; and connecting the first chip and the second chip.

18. The method of manufacturing a semiconductor structure according to claim 17, wherein the connecting the first chip and the second chip comprises:

melting the second conductor and the fourth conductor at a first temperature, such that the first chip is connected to the second chip;

wherein the first temperature is lower than the melting point of the first conductor and the melting point of the third conductor.

19. The method of manufacturing a semiconductor structure according to claim 18, wherein the connecting the first chip and the second chip further comprises:

bonding the connected first chip and the connected second chip under an annealing condition at a second temperature, such that a bonding structure is formed between the first conductive contact pad and the second conductive contact pad;

wherein the first temperature is lower than the second temperature.

20. The method of manufacturing a semiconductor structure according to claim 17, wherein the second conductor is formed on the first conductor through electroplating or printing; and the fourth conductor is formed on the third conductor through electroplating or printing.

* * * * *

UNITED STATES PATENT AND TRADEMARK OFFICE
CERTIFICATE OF CORRECTION

| | | |
|---|---|---|
| PATENT NO. | : 11,488,917 B1 | Page 1 of 1 |
| APPLICATION NO. | : 17/648313 | |
| DATED | : November 1, 2022 | |
| INVENTOR(S) | : Chuang | |

It is certified that error appears in the above-identified patent and that said Letters Patent is hereby corrected as shown below:

On the Title Page

Item (73) Please insert: --CHANGXIN MEMORY TECHNOLOGIES, INC., HEFEI (CN)--

Signed and Sealed this
Twenty-second Day of August, 2023

Katherine Kelly Vidal
*Director of the United States Patent and Trademark Office*